United States Patent
Bielski

(10) Patent No.: US 6,492,802 B1
(45) Date of Patent: Dec. 10, 2002

(54) APPARATUS AND METHOD FOR DETECTING DEFECTS IN A MULTI-CHANNEL SCAN DRIVER

(75) Inventor: Scott A. Bielski, Sussex, WI (US)

(73) Assignee: GE Medical Technology Services, Inc., Pewaukee, WI (US)

( * ) Notice: Subject to any disclaimer, the term of this patent is extended or adjusted under 35 U.S.C. 154(b) by 159 days.

(21) Appl. No.: 09/616,869

(22) Filed: Jul. 14, 2000

(51) Int. Cl.[7] .............................................. G01R 31/28
(52) U.S. Cl. ................................. 324/158.1; 324/765
(58) Field of Search ............................ 324/765, 158.1, 324/537, 770; 714/726, 724

(56) References Cited

U.S. PATENT DOCUMENTS

| | | | |
|---|---|---|---|
| 5,331,179 A | * 7/1994 | Lee et al. | 250/591 |
| 5,528,782 A | 6/1996 | Pfeuffer et al. | 5/611 |
| 5,654,970 A | * 8/1997 | DaCosta et al. | 714/726 |
| 5,877,501 A | 3/1999 | Ivan et al. | 250/370.09 |

FOREIGN PATENT DOCUMENTS

| | | |
|---|---|---|
| EP | 0 559 940 A1 | 9/1993 |
| EP | 0 847 740 A1 | 6/1998 |
| GB | 965 492 A | 6/1994 |

\* cited by examiner

*Primary Examiner*—Ernest Karlsen
(74) *Attorney, Agent, or Firm*—Fletcher, Yoder & Van Someren

(57) ABSTRACT

A technique is described for detecting defects such as short circuits in a device such as a discrete pixel detector used in a digital x-ray system. The technique employs test circuits associated with each row driver of the detector. The test circuits are enabled by a test enable input signal, and the row driver sequentially enables the rows of the detector, along with the individual test circuits. In a test sequence, output signals from the row test circuits are monitored to identify whether a defect, such as a short circuit, is likely to exist in the row or row driver. The test circuitry adds only minimal area and complexity to the row driver function, providing a high degree of test coverage at a low cost, with minimal likelihood of test circuitry-induced failures.

30 Claims, 7 Drawing Sheets

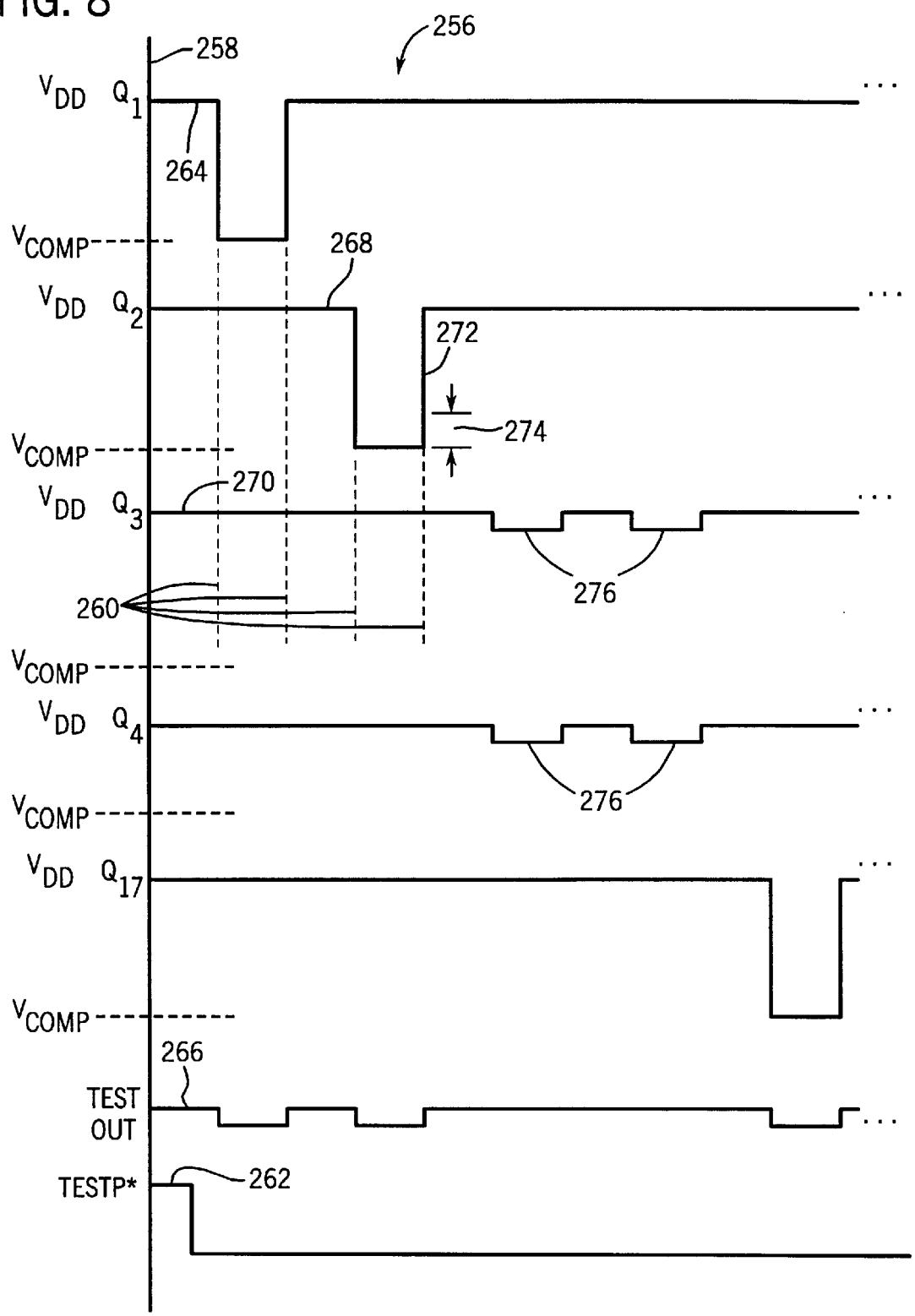

APPARATUS AND METHOD FOR DETECTING DEFECTS IN A MULTI-CHANNEL SCAN DRIVER

FIELD OF THE INVENTION

The present invention relates generally to the field of digital imaging devices, such as digital x-ray imaging systems. More particularly, the invention relates to a technique for testing portions of driver circuitry in digital detector arrays of the type used in direct digital x-ray systems.

BACKGROUND OF THE INVENTION

Increasing emphasis is being placed in a wide variety of imaging devices on direct digital imaging techniques. In x-ray systems, for example, techniques are being developed for detecting intensities of radiation striking a digital detector surface during examinations. In the course of the examinations, an x-ray source emits radiation which traverses a subject, such as a human patient. The x-ray intensity is, however, affected by the various tissues and structures within the subject, resulting in intensity variations at the detector, which is placed behind the subject with respect to the source. By identifying intensities of resulting radiation at a large number of locations arranged in a matrix, the detector allows a data set to be acquired which can be used to reconstruct a useful image of the subject.

In digital detectors for x-ray systems a detector surface is divided into a matrix of picture elements or pixels, with rows and columns of pixels being organized adjacent to one another to form the overall image area. When the detector is exposed to radiation, photons impact a scintillator coextensive with the image area. A series of detector elements are formed at row and column crossing points, each crossing point corresponding to a pixel making up the image matrix. In one type of detector, each element consists of a photodiode and a thin film transistor. The cathode of the diode is connected to the source of the transistor, and the anodes of all diodes are connected to a negative bias voltage. The gates of the transistors in a row are connected together and the row electrode is connected to scanning electronics. The drains of the transistors in each column are connected together and each column electrode is connected to additional readout electronics. Sequential scanning of the rows and columns permits the system to acquire the entire array or matrix of signals for subsequent signal processing and display.

In use, the signals generated at the pixel locations of the detector are sampled and digitized. The digital values are transmitted to processing circuitry where they are filtered, scaled, and further processed to produce the image data set. The data set may then be used to store the resulting image, to display the image, such as on a computer monitor, to transfer the image to conventional photographic film, and so forth. In the medical imaging field, such images are used by attending physicians and radiologists in evaluating the physical conditions of a patient and diagnosing disease and trauma.

In digital detectors of the type described above, problems may arise due to short circuits which may exist or develop between elements of the detector circuitry. In particular, both during the manufacturing and assembly steps employed in producing the detectors and related circuitry, electrical shorts may occur between conductors of adjacent rows, between rows and bias supplies, and between rows and ground. Such shorts may lead to imaging defects which significantly impair the utility of the detector. In certain cases, early detection of such defects may permit replacement or repair of detector circuitry, or may indicate the need to replace an entire section of the detector circuitry.

While such short circuits can be detected by various procedures, conventional techniques are time consuming and difficult to implement. There remains a need, therefore, for efficient, rapid, and dependable techniques designed to detect short circuits and similar defects in scan driver circuitry. There is a particular need for a technique which can be implemented in direct digital detector circuits, such as those used in digital x-ray imaging systems.

SUMMARY OF THE INVENTION

The present invention provides a technique for identifying potential short circuits and other defects in scan driver circuitry designed to respond to these needs. The technique is particularly well suited for implementation in circuitry associated with digital detectors comprising an array of rows and columns, and capable of producing signals representative of radiation impacting a plurality of pixels defined by the rows and columns. The structure employed in the technique is designed to facilitate its implementation in one or more row driver integrated circuits. The technique advantageously employs an arrangement of transistors which are dedicated to testing for shorts in row output drivers, thereby reducing or eliminating the need to externally probe outputs simultaneously while individually enabling each row of the detector. Moreover, open-test outputs may be electrically linked in the structure, such as via wired-NOR functional groups. This further minimizes the number of inputs to be monitored by subsystem control electronics.

BRIEF DESCRIPTION OF THE DRAWINGS

FIG. 8 is a graphical representation of a series of test pulses in an exemplary test for short circuits in digital detector circuitry employing the arrangement of FIG. 7.

DETAILED DESCRIPTION OF THE INVENTION

Figure 1:
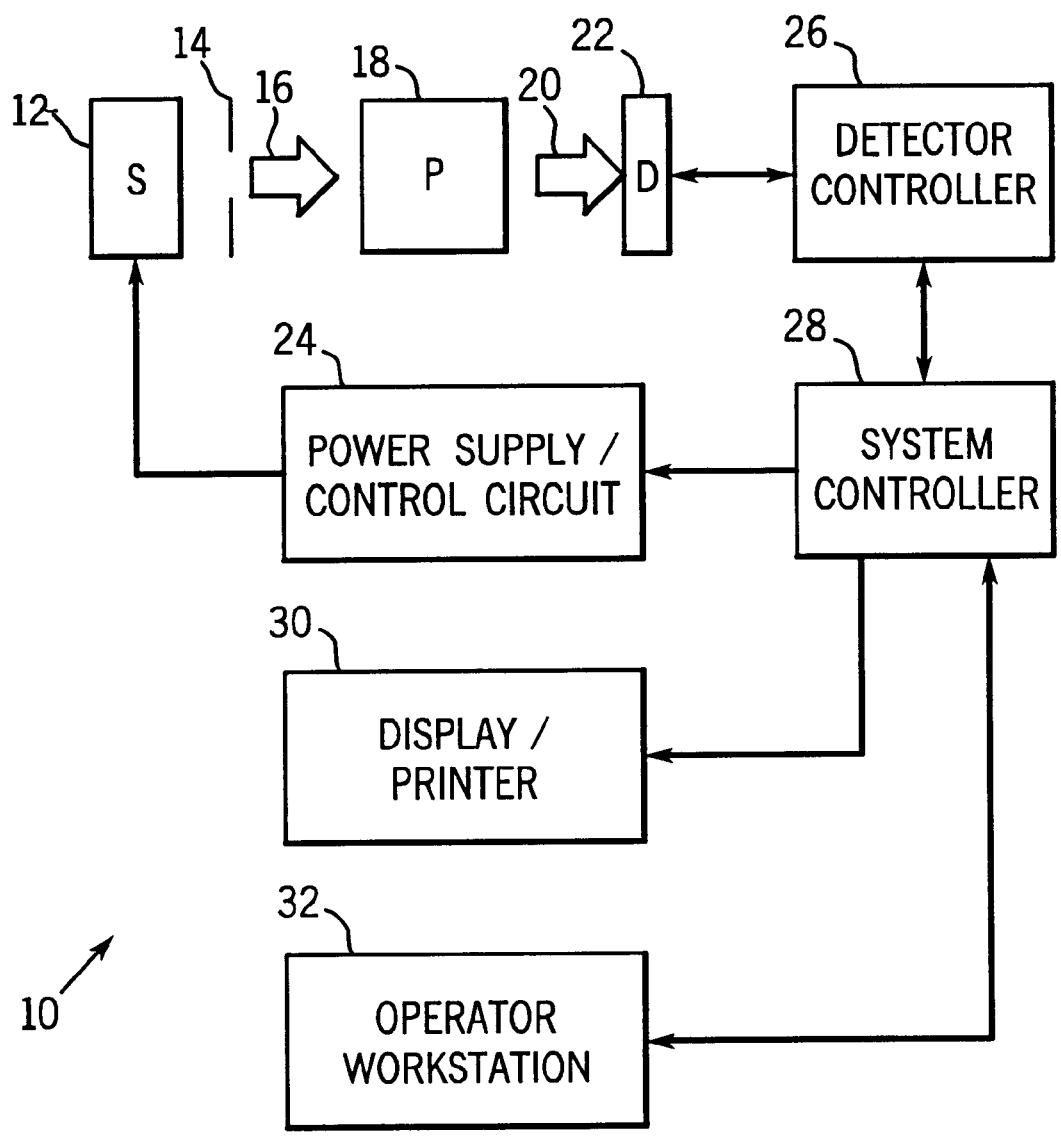
FIG. 1 is a general schematic diagram of a digital x-ray imaging system employing a row driver testing arrangement in accordance with certain aspects of the present invention.

Referring now to the drawings, FIG. 1 represents an imaging system in the form of a digital x-ray system 10.

Imaging system 10 includes a source of x-ray radiation 12 positioned adjacent to a collimator 14. Collimator 14 permits a stream 16 of radiation to pass into a region in which a subject, such as a human patient 18 is positioned. A portion of the radiation 20 passes through or around the subject and impacts a digital x-ray detector represented generally at reference numeral 22. As described more fully below, detector 22 converts the x-ray photons received on its surface to lower energy photons, and subsequently to electrical signals which are acquired and processed to reconstruct an image of the features within the subject.

Source 12 is controlled by a power supply/control circuit 24 which furnishes both power and control signals for examination sequences. Moreover, detector 22 is coupled to a detector controller 26 which commands acquisition of the signals generated in the detector. Detector controller 26 may also execute various signal processing and filtration functions, such as for adjustment of dynamic ranges, interleaving of digital image data, and so forth. Both power supply/control circuit 24 and detector controller 26 are responsive to signals from a system controller 28. In general, system controller 28 commands operation of the imaging system to execute examination protocols and to process acquired image data. Accordingly, system controller 28 will typically include a general purpose or application-specific computer, associated memory circuitry, interface circuits, and so forth. In the embodiment illustrated in FIG. 1, system controller 28 is linked to a display/printer 30 and to an operator work station 32. In a typical system configuration, display/printer 30 will permit reconstructed images to be output for use by an attending physician or radiologist. Operator work station 32 allows examinations to be commanded by a clinician or radiologist, permits system configurations to be reviewed, and so forth.

Figure 2:
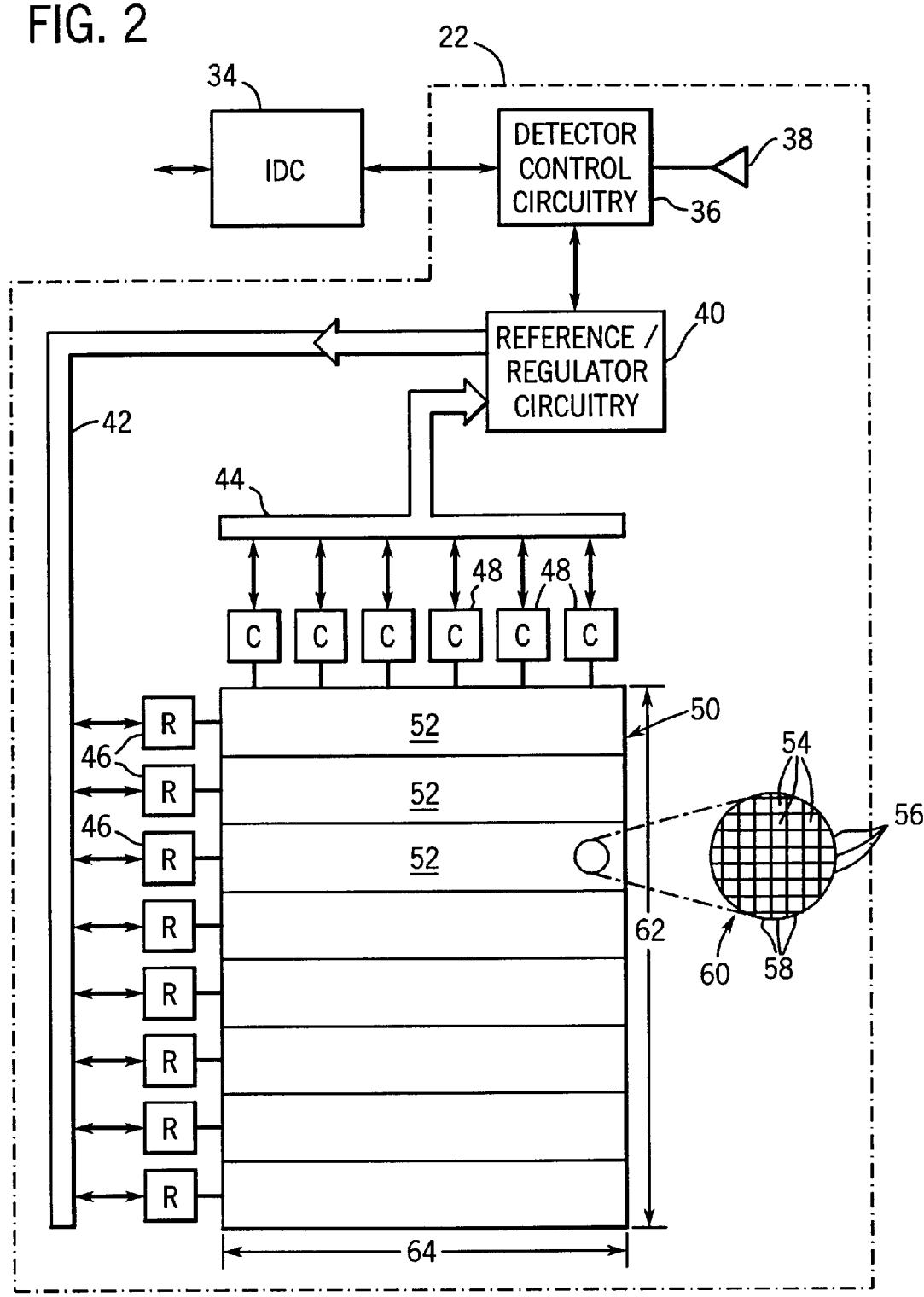
FIG. 2 is a diagrammatical representation of a digital detector system for use in an imaging system of the type shown in FIG. 1.

FIG. 2 is a diagrammatical representation of functional components of the digital detector 22. FIG. 2 also represents an imaging detector controller or IDC 34 which will typically be configured within detector controller 26. IDC 34 includes a CPU or digital signal processor, as well as memory circuits for commanding acquisition of sensed signals from the detector. IDC 34 is coupled via two-way fiber optic conductors to detector control circuitry 36 within detector 22. IDC 34 thereby exchanges command signals for image data with the detector during operation.

Detector control circuitry 36 receives DC power from a power source, represented generally at reference numeral 38. Detector controller circuitry 36 is configured to originate timing and control commands for row and column drivers used to transmit sensed signals during a data acquisition phase of operation. Circuitry 36 therefore transmits power and control signals to reference/regulator circuitry 40, and receives digital image pixel data from circuitry 40.

Detector 22 consists of a scintillator that converts the x-ray photons received on a detector surface during examinations to lower energy (light) photons. An array of photo detectors then converts the light photons to electrical signals which are representative of the number of photons or intensity of the radiation impacting individual pixel regions of the detector surface. As described below, readout electronics convert the resulting analog signals to digital values that can be processed, stored, and displayed using well known image processing techniques. In a presently preferred embodiment, the array of photo detectors is formed of a single base of amorphous silicon. The array elements are organized in rows and columns, with each element consisting of a photo diode and a thin film transistor. The cathode of each diode is connected to the source of the transistor and the anodes of all diodes are connected to a negative bias voltage. The gates of the transistors in each row are connected together and the row electrodes are connected to the scanning electronics described below. The drains of the transistors in a column are connected together and an electrode for each column is connected to readout electronics. The technique described below permits testing of the detector and the row (or column) driver electronics for malfunctions, such as short circuits.

In the particular embodiment illustrated in FIG. 2, a row bus 42 includes a plurality of conductors for enabling readout from the various columns of the detector as well as for disabling rows and applying a charge compensation voltage to selected rows. A column bus 44 includes additional conductors for commanding readout from the columns while the rows are sequentially enabled. Row bus 42 is coupled to a series of row drivers 46, each of which commands enabling of a series of rows in the detector. Similarly, readout electronics 48 are coupled to column bus 44 for commanding readout of all of columns of the detector.

In the illustrated embodiment row drivers 46 and readout electronics 48 are coupled to a detector panel 50 which may be subdivided into a plurality of sections 52. Each section 52 is coupled to one of the row drivers 46, and includes a number of rows. Similarly, each column driver 48 is coupled to a series of columns. The photo diode and thin film transistor arrangement mentioned above thereby defines a series of pixels or discrete picture elements 54 which are arranged in rows 56 and columns 58. The rows and columns define an image matrix 60 having a height 62 and a width 64.

It should be noted that the particular configuration of the detector panel 50, and the subdivision of the panel into rows and columns driven by row and column drivers is subject to various alternate configurations. In particular, more or fewer row and column drivers may be used, and detector panels having various matrix dimensions may be thereby defined. Moreover, the detector panel may be further subdivided into regions of multiple sections, such as along a vertical or horizontal center line.

Figure 3:
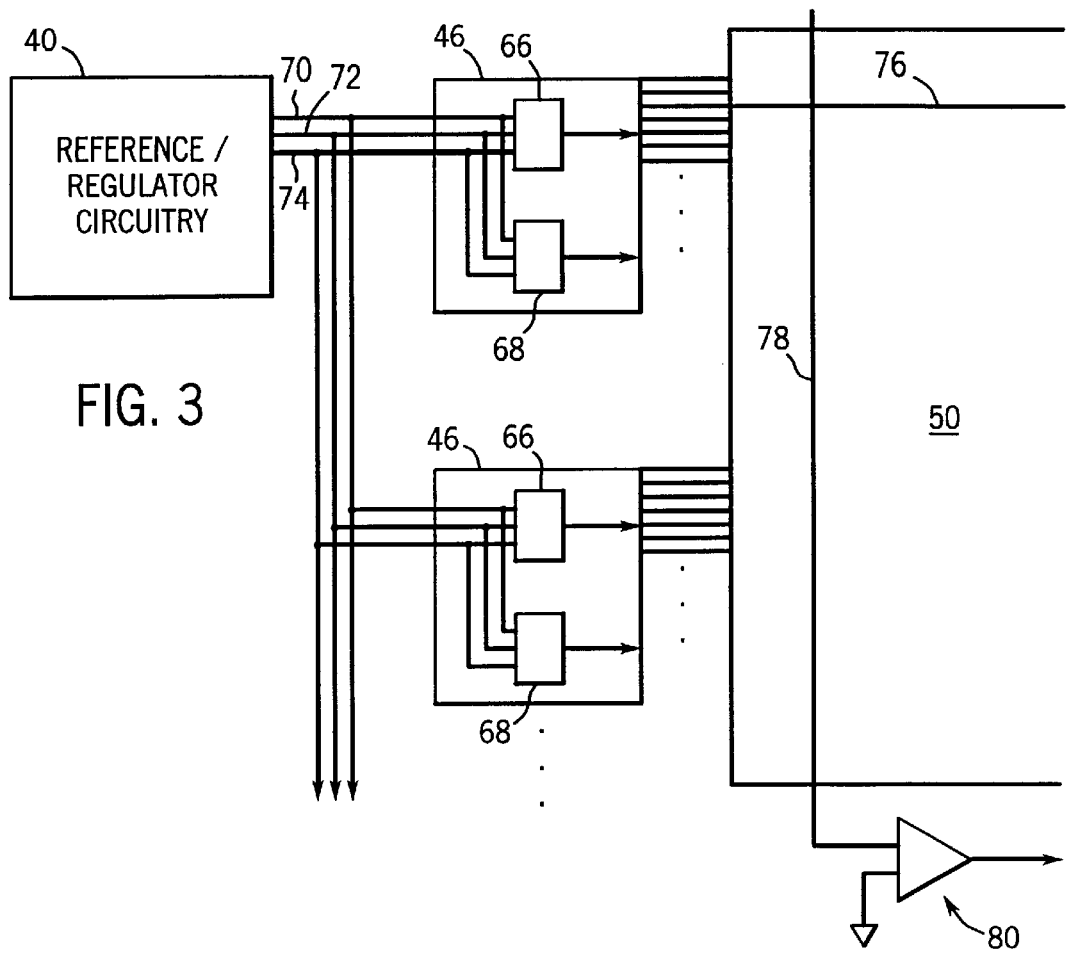
FIG. 3 is a diagrammatical representation of a portion of the detector circuitry shown in FIG. 2, representing, more particularly, the circuitry for scanning rows and reading columns of the detector.

FIG. 3 represents in somewhat greater detail a pair of the row drivers 46 shown in FIG. 2 coupled to the detector panel 50. As mentioned above, row drivers 46 receive various command signals from reference/regulator circuitry 40 for enabling of rows in the detector panel. In the illustrated embodiment, each row driver 46 includes a pair of row driver chips or RDCs 66 and 68. Each RDC is configured to command enabling of a plurality of rows of the detector. Reference/regulator circuitry 40 receives various control and command signals for operation of the RDCs, such as scan mode command signals, charge compensation command signals, enable strobe signals, and so forth. In a presently preferred configuration, circuitry 40 includes control logic configured for command of the RDCs. Circuitry 40 outputs the commands on a plurality of conductors within the row bus 42 (see FIG. 2). In the diagrammatical representation of FIG. 3, three such conductors are illustrated, including a $V_{on}$ conductor 70, a $V_{off}$ conductor 72, and a $V_{COMP}$ conductor 74. Each of the conductors is coupled to each RDC. Other conductors (not shown) may be provided, for commanding output of the RDCs for enabling, disabling and charge compensating the individual rows of the detector.

As mentioned above, each row driver is coupled to a plurality of row electrodes, such as row electrode 76 illustrated in FIG. 3. Each row electrode traverses a series of column electrodes, of which a single column electrode 78 is represented in FIG. 3. As mentioned above, photo diodes and thin film transistors (not represented in FIG. 3) are provided and coupled to each row and column electrode to form the detector panel array. Each column electrode is coupled to an ARC (analog readout chip) amplifier 80 which reads out the signal produced at the photo diode of each row and column crossing during readout sequences.

Readout of sensed signals from the detector proceeds as follows. Multiple scan modes may be selected for reading data from the detector, or for testing operability of the detector. In a presently preferred embodiment four such readout or scan modes are provided. In a first or high resolution mode, a single row is enabled at a time. While each row of the panel is thus sequentially enabled for readout, the columns in the detector are read, thereby progressively reading out all signals from the array. Other scan modes may provide for different numbers of rows to be simultaneously enabled in groups, with the groups being sequentially scanned.

Various defects or anomalies may occur in the panel and drive circuitry described above. For example, potentially serious defects may include open circuits or short circuits, such as between row electrodes, between row electrodes and bias potential sources, and between row electrodes and ground. Such defects may be detected though the techniques set forth below.

In particular, various difficulties may arise in the panel and associated electronics, both during manufacture and during subsequent operation. For example, neighboring rows of the panel may become shorted to one another, both within the panel and within conductive lines or traces which convey the desired potentials to the individual row elements. Similarly, the row conductors or associated electronics may become shorted to bias supplies, including ground. Such shorts may cause significant anomalies in the acquired data, such as the appearance of one or more entire rows or data which do not correspond to the received radiation at the corresponding pixel locations. To avoid such anomalies, the present technique facilitates the detection of such short circuits and other defects. In a present embodiment, test circuitry is provided, preferably directly in the RDCs. Alternatively, similar circuitry may be provided in associated chips or modules.

Figure 4:
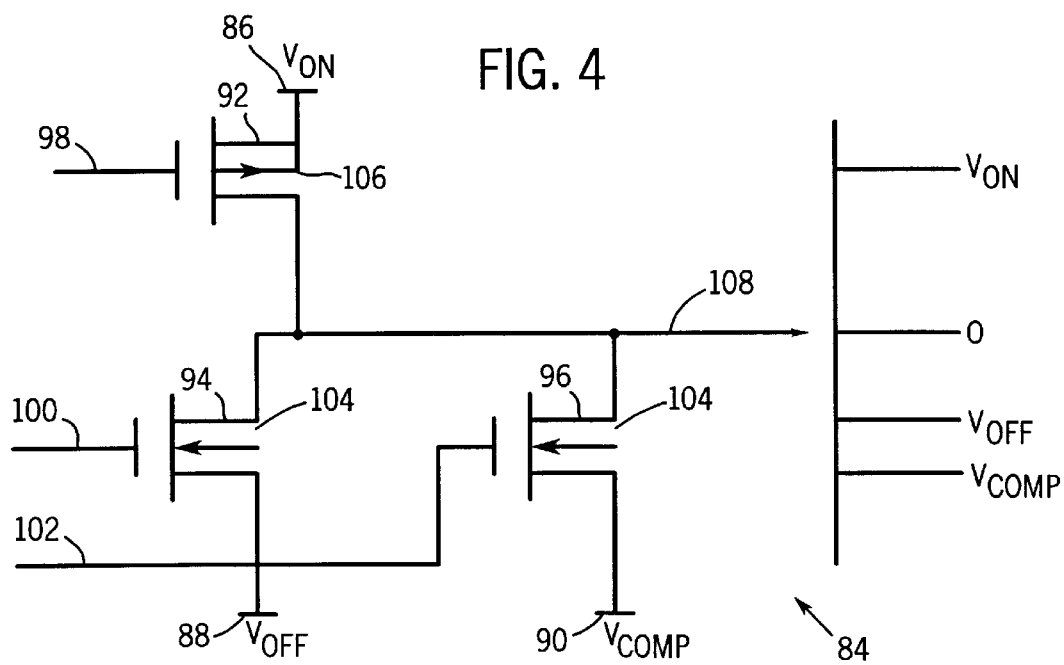
FIG. 4 is a schematic representation of circuitry for applying various potentials to the rows of the detector.

FIG. 4 represents a portion of a solid state control circuit 84 employed in the row drivers discussed above. As shown in FIG. 4, output from the circuit may have a value $V_{ON}$ or $V_{DD}$ corresponding to the enabling voltage, a value $V_{OFF}$ corresponding to the "off" state, or a value $V_{COMP}$ corresponding to the compensation voltage state. The transistors of circuit 84 are coupled to corresponding voltage sources, such as through conductors 70, 72 and 74 (see FIG. 3), as shown by reference numerals 86, 88 and 90. In the illustrated embodiment, three transistors 92, 94 and 96 are coupled to one another as illustrated. In particular, transistor 92 is a p-channel MOSFET, the gate of which is coupled to a control line 98, the source of which is coupled to the voltage $V_{ON}$ (as illustrated at reference numeral 86), and the drain of which is coupled to an output line 108. Transistor 94 is an n-channel MOSFET the gate of which is coupled to a control line 100, the source of which is coupled to the voltage $V_{OFF}$ (at reference numeral 88), and the drain of which is coupled to output line 108. Finally, transistor 96 is also an n-channel MOSFET, the gate of which is coupled to a third control line 102, the source of which is coupled to the voltage Vcomp (at reference numeral 90), and the drain of which is coupled to outline line 108.

Control lines 98, 100 and 102 are coupled to upstream control logic devices and transmit control signals to the transistors for selecting the voltage on output line 108 which is transmitted to the particular row electrode. In the present embodiment, a plurality of such circuits are included on each RDC for driving corresponding rows of the detector. As will be appreciated by those skilled in the art, when a logical "low" signal is transmitted on control line 98, transistor 98 is placed in a conductive state, applying the enabling voltage $V_{ON}$ to the outline line 108 and thus to a row electrode 76. Of course, during this time, the control logic turns off transistors 94 and 96. A logical "high" signal on control line 100 switches transistor 94 to a conductive state to apply the logical low or off voltage $V_{OFF}$ to the row electrode 76. Finally, a logical "high" signal at control line 102 places transistor 96 in a conductive state to apply the compensating voltage $V_{COMP}$ to the row electrode 76. As mentioned above, down stream of the circuit, along the row electrode, a series of transistors (not shown) are placed corresponding to each column traversed by the row electrode. Output line 108 is coupled to the gate of the transistors to provide the desired enabling signals or charge compensation signals.

Figure 5:
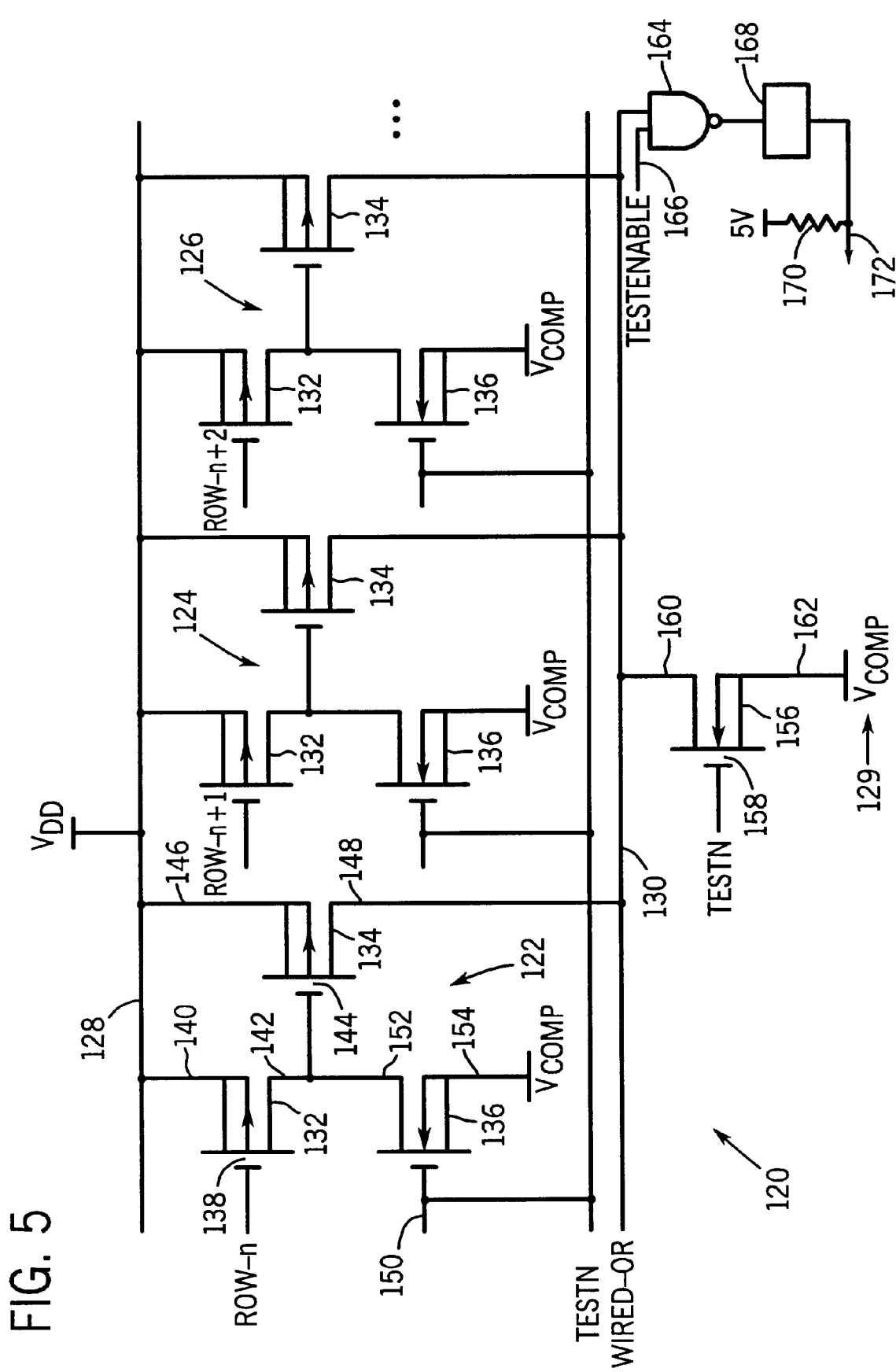
FIG. 5 is a diagrammatical representation of circuitry for testing row driver electronics to identify potential short circuits between rows, between rows and ground, and between rows and negative bias sources in the electronics in a detector of the type illustrated in the previous figures.

FIG. 5 represents circuitry for detecting anomalies in the row driver circuitry, such as short circuits between rows, between rows and ground, and between rows and negative bias supplies. Generally, the technique entails resetting internal devices of the RDC, and shifting a single bit through a shift register of the device, while enabling the associated output to an "on" state between each data shift, that is, enabling a single row at a time while other rows are "off." Assuming there are no shorts to the other outputs (which remain at the "off" bias state), or to the bias supplies (other than the "on" bias), the active output will swing towards the positive "on" bias since the sense circuits are positive logic circuits. Internal to the RDC, associated with each row driver output stage, is a three transistor voltage sense circuit, three such circuits being illustrated in FIG. 5. If the driven row output positive swing is within a gate-to-source (turn-off) threshold of an associated p-channel MOSFET, a change in state of a wired-OR test output takes place. If any short exists, the active output would not swing sufficiently to turn the MOSFET off, resulting in the test output failing to change state, and providing an indication of the short condition. In effect, in the illustrated embodiment, the test circuitry functions as a voltage comparator with offset. If the transitions tested are correct, the state of the comparators (p-channel MOSFETs) changes in an expected manner.

In the embodiment shown in FIG. 5, the test circuitry, designated generally by reference numeral 120, is provided on the RDC associated with the groups of rows. Test circuitry 120 includes row sense circuitry for each row of the associated portion of the detector, as indicated by reference numerals 122, 124, and 126. Each row sense circuit includes a group of three solid state devices for detecting short circuits of the associated row. The row sense circuitry is coupled between high and low potentials ($V_{DD}$ and $V_{COMP}$, respectively), as indicated at reference numerals 128 and 129, respectively.

Referring now more particularly to the illustrated arrangement of each row sense circuit, the row sense circuits comprise a pair of p-channel MOSFETs 132 and 134, and an n-channel MOSFET 136. The first device 132 has its gate, denoted 138 in FIG. 5, coupled to an output line for an associated row. For example, gate 138 of circuit 132 would be coupled to an output line ROW-n such as line 108 of FIG. 4. The source 140 of the device is coupled to the high potential bus 128. The drain 142 of device 132 is coupled to the gate 144 of the second device 134. The source 146 of this device is also coupled to the high potential bus line 128. The drain of device 134 is coupled to a "wired-OR" bus line 130.

The gate of the third device 136 is coupled to a bias source, which serves as a test enable TESTN. Line 150 will, therefore, be associated with test drive electronics for providing a test enable bias signal TESTN to device 136 when row testing is desired, such as during manufacture or troubleshooting of the detector circuitry. The drain 152 of device 136 is coupled to drain 142 of device 132 and commonly to gate 144 of device 134. The source 154 of device 136 is coupled to a desired potential, such as the most negative power supply available, here $V_{COMP}$. In the illustrated embodiment, high potential bus line 128 is coupled to a row enable potential $V_{DD}$, such as +12 volts. The negative bias voltage $V_{COMP}$ applied to source 154 of device 136 may be any suitable negative voltage, such as −12 volts. Again, bus line 130 functions as a "wired-OR" logic signal.

The series of rows sense circuits is coupled to a test enable device 156 which essentially acts as a weak current source during operation. In the illustrated embodiment, device 156 is an n-channel MOSFET having a gate 158 coupled to test enable circuitry for receiving a test bias signal TESTN at the same time as gate 150 of device 136. The drain 160 of device 156 is coupled to the "wired-OR" signal line 130. The source 162 of device 156 is coupled to a low potential source, preferably the same potential as source 154 of device 136. It should be noted that through the foregoing structure, a single device 156 is capable of serving all row sense circuits for a row driver chip. In the illustrated embodiment, 128 row sense circuits are provided in parallel to one another and are coupled to a single test enable device 156.

Output of the resulting signals during tests of the circuitry of FIG. 5 is provided via "wired-OR" signal line 130. Two inputs are provided to a NAND gate 164, namely "wired-OR" signal line 130, and a test enabled input signal TESTENABLE as provided at input 166 in FIG. 5. The output from the NAND gate 164 is directed to an RDC test output IC-PAD 168 which, in a preferred embodiment, is an open collector device permitting multiple RDCs to be tied to a common input of a CPU used to analyze the test results. A pull-up resistor 170 is provided between the output of the open drain device 168 and a reference potential, such as 5 volts. Finally, output 172 from device 168 is transferred to an analyzing circuit, such as the CPU used to drive the rows of the detector.

In operation, a test enable bias signal TESTN is applied to the circuitry of FIG. 5 to drive devices 136 of each row sense circuit via gate 150, as well as the gate 158 of device 156. TESTN is a bias signal which is produced from a bias generator circuit (not shown). The generator circuit is enabled by the TESTENABLE input signal and may produce a bias signal TESTN whose voltage is between $V_{DD}$ and $V_{COMP}$. After the TESTENABLE signal is generated, each row of the RDC is sequentially enabled to a "$V_{ON}$" state as described above with reference to FIG. 4. If all other rows associated with the RDC are off (at the $V_{OFF}$ default bias), all associated devices 132 of the circuitry of FIG. 5 will be on, resulting in all P-Channel devices 134 of the test circuitry being off. As a result, the output at the "wired-OR" signal line 130 will remain at the low voltage $V_{COMP}$. On the other hand, when any single row is enabled, the device 132 of the associated row sense circuit will be off, and the device 134 in the same sense circuit will assume a conducting state due to the fact that its gate will be pulled down to the $V_{COMP}$ potential by device 136. The output at signal line 130 will then be drawn to the potential of bus 128, indicating a correctly operating output driver. Moreover, if the output at bus 130 assumes the higher potential, and the test enable signal TESTENABLE is provided at input 166 to NAND gate 164, an appropriate test output signal is provided to open collector device 168 which can be read by the downstream circuitry.

If, through the foregoing test sequence, the test output does not change states, a problem is considered to be detected with the particular row or row driver. Moreover, the present arrangement is suitable for detecting shorts between rows of the detector panel and related electronics, as well as between rows and other circuitry such as bias supplies. In particular, in the case of a row-to-row short, a voltage drop from the anticipated level would be detectable greater than the gate-threshold tolerance of the device 132 of the row sense circuit. Other shorts would provide a drop in response which could be similarly detected.

Figure 6:
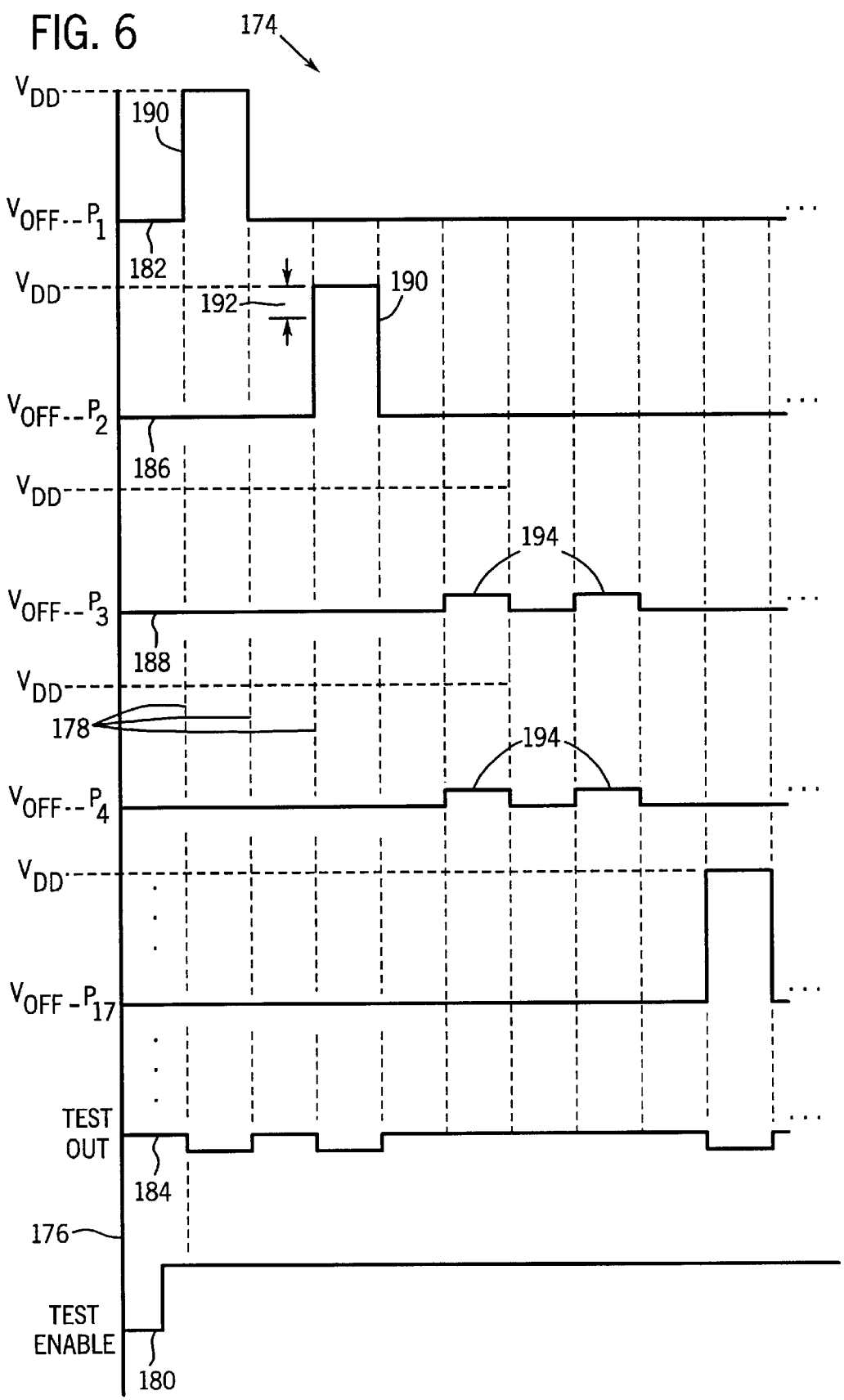
FIG. 6 is a graphical representation of a series of test pulses in an exemplary test for short circuits in digital detector circuitry employing the arrangement of FIG. 5.

FIG. 6 illustrates graphically a series of row drivers of an RDC tested in accordance with the present technique, employing circuitry such as that illustrated in FIG. 5. As shown in FIG. 6, the test sequence, indicated by reference numeral 174, consists of a series of output pulses which may be represented along a vertical axis 176. At specific time intervals 178, the test sequence proceeds through the rows driven by the RDC being tested. In FIG. 6, the test enable signal TESTN discussed above is applied and remains applied throughout the test sequence as indicated by trace 180. As previously discussed, the rows are initiliazed to the $V_{OFF}$ state. Rows are then sequentially enabled to the $V_{DD}$ state beginning with a first row as indicated at trace 182 for a row labeled $P_1$. The test output is monitored through this sequence at output IC-PAD 168 as indicated by trace 184 in FIG. 6. Each subsequent row enabling step is preceded by disabling of the previously enabled row. Thus, each subsequent row enabling step produces a trace which may be represented as 186, 188, and so forth, for each subsequent row.

As indicated above, a change in state is expected as each subsequent row is enabled, as indicated at pulses 190 in FIG. 6. A tolerance 192 equal to the gate-to-source threshold of the row driver device is preferably lower than the detectable change in state in the event of a short circuit of the row. Such short circuits will be manifested in lower than expected rises in the output level, as indicated at reference numeral 194 in FIG. 6. That is, the signal level of a shorted circuit will not reach $V_{DD}$. In the illustrated example, rows $P_3$ and $P_4$ are likely shorted to one another. As a result, upon enabling of these rows, the test output as provided by trace 184 did not decline as would have been expected for a normal test. A similar variation from the expected results would occur in test trace 184 in the event of shorts between a row and bias supply $V_{COMP}$ or shorts between a row and ground.

Figure 7:
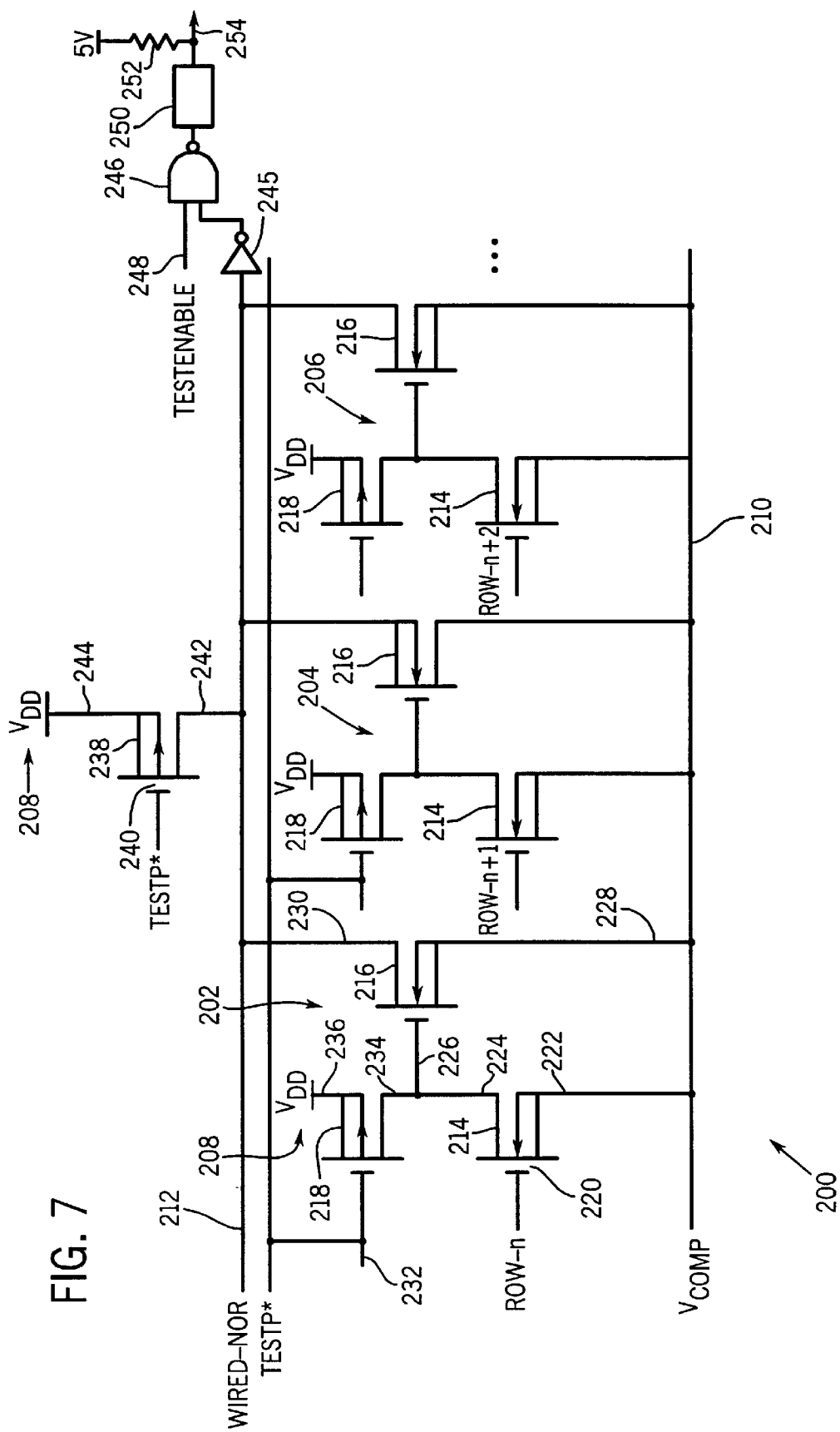
FIG. 7 is a diagrammatical representation of circuitry for testing row driver electronics to identify potential short circuits between rows, between rows and ground, and between rows and positive bias sources in the electronics in a detector of the type illustrated in the previous figures.

FIG. 7 represents circuitry for detecting anomalies in the row driver circuitry, such as short circuits between rows, between rows and ground, and between rows and positive bias supplies. Generally, the technique entails setting all row outputs of the RDC to a positive bias level ($V_{ON}/V_{DD}$), and shifting a single bit "0" through a shift register of the device, by driving a single row at a time to the most negative bias voltage, here $D_{SS}$, while all other rows remain at the positive bias voltage, here $V_{DD}$. During operation of the test circuit illustrated in FIG. 7, the active output will be driven to $D_{SS}$ since the sense circuits are negative logic circuits. Internal to the RDC, associated with each row driver output stage, is a three-transistor voltage sense circuit, three such circuits being illustrated in FIG. 7. If the driven row output negative swing is less than source threshold of an associated n-channel MOSFET, a change in the state of a wired-NOR test output takes place. If any short exists, the active output would not swing sufficiently to turn the MOSFET on, resulting in the test output failing to change state and providing an indication of the short condition. In effect, in the illustrated embodiment, the test circuitry functions as a voltage comparator with offset. If the transitions tested are correct, the state of the comparitors (n-channel MOSFETs) changes in an expected manner.

In the embodiment shown in FIG. 7, the test circuitry designated generally by reference numeral 200, may be provided on the RDC associated with the groups of rows. Test circuitry 200 includes row sense circuitry for each row of the associated portion of the detector, as indicated by reference numerals 202, 204, and 206. Each row sense circuit includes a group of three solid state devices for detecting short circuits of the associated row. The row sense circuitry is coupled between high and low potentials ($V_{DD}$ and $V_{COMP}$), as indicated at reference numerals 208 and 210 respectively.

Referring now more particularly to the illustrated arrangement of each rows sense circuit, the row sense circuits comprise a pair of n-channel MOSFETs 214 and 216, and p-channel MOSFET 218. The first device 214 has its gate 220 coupled to an output line for an associated row. For example, gate 220 of the circuit 202 would be coupled to an output line such as line 108 of FIG. 4. The source 222 of the device 214 is coupled to the low potential bus 210. The drain 224 of the device 214 is coupled to the gate 226 of the second device 216. The source 228 of this device is also coupled to the low potential bus line 210. The drain of the device 216 is coupled to a "wired-NOR" common bus line 212.

The gate of the third device 218 is coupled to a biased source TESTP*, which serves as an active-low test enable. The device 218 will act as a weak pull-up when it is enabled in test mode. Line 232 will, therefore, be associated with test drive electronics for a test enabling bias signal TESTP* to device 214 when row testing is desired. The drain 234 of device 218 is coupled to the drain 224 of device 214 and commonly to gate 226 of device 216. The source 236 of device 218 is coupled to a desired potential such as a positive power supply, here $V_{DD}$. In the illustrated embodiment, low potential bus line 210 is coupled to a row enable potential $V_{COMP}$, such as −12 volts. The positive bias voltage applied to source 236 of device 218 may be any suitable positive voltage, such as +12 volts. Bus line 212 functions as a "wired-NOR" logic signal.

The series of row sense circuits is coupled to a test enable device 238 which acts as a current source during operation. In the illustrated embodiment, device 238 is a p-channel MOSFET having a gate 240 coupled to test enable circuitry for receiving a test bias signal TESTP* at the same time as gate 232 of device 218. The drain 242 of device 240 is coupled to the "wired-NOR" signal line 212. The source 244 of device 238 is coupled to a high potential source, preferably the same potential as source 236 of device 218. The device 238 acts as a weak pull-up. It should be noted that through the foregoing structure, a single device 238 is capable of serving all row sense circuits as a row driver chip. In the illustrated embodiment, 128 row sense circuits are provided in parallel to one another and are coupled to a single test enable device 238.

Output of the resulting signals during tests of the circuitry illustrated in FIG. 7 is provided via "wired-NOR" signal line 212 after the signal line 212 has been inverted by inverter 245. Two inputs are provided to a NAND gate 246, namely the inversion of the "wired-NOR" signal line 212, and a TESTENABLE signal as provided at input 248. The output from the NAND gate 246 is directed to an RDC test output IC-PAD 250 which, in a preferred embodiment, is an open collector device permitting multiple RDCs to be tied to a common input of a CPU used to analyze the test results. A pull-up resistor 252 is provided between the output of the device 168 and a 5V supply voltage. Finally, output 254 from device 250 is transferred to an analyzing circuit, such as the CPU used to drive the rows of the detector.

In operation, a test enable bias signal TESTP* is applied to the circuitry of FIG. 7 to drive P-Channel devices 218 of each row sense circuit via gate 232 as well as the gate 240 of device 238. TESTP* is a bias signal which is produced from a bias generator circuit (not shown). The bias generator circuit is enabled by the TESTENABLE signal and may produce a bias signal TESTP* whose voltage is between $V_{DD}$ and ground. Devices 218 and 238 therefore, act as "weak" pull-ups. After the TESTENABLE signal is generated, all rows of the RDC are enabled to an "on" state as described above with reference to FIG. 4. If all rows associated with the RDC are on (at the $V_{DD}$ default bias) all devices 214 will be on, resulting in all devices 216 of the test circuitry being off. As a result, the output at the "wired-NOR" signal line 212 will remain at the high voltage $V_{DD}$. On the other hand, when any single row is driven low, the device 214 of the associated row sense circuit will be off, and the device 216 in the same sense circuit will assume a conducting state due to the fact that its gate will be pulled up to the $V_{DD}$ potential by device 218. The output at signal line 212 will then be drawn to the potential of bus 210, indicating a correctly operating output driver. The signal line 212 is then inverted for proper NAND logic. If the output at bus 212 assumes the lower potential, both the inversion of signal line 212 and the TESTENABLE signal (provided at input 248) are delivered to the NAND gate 246, and an appropriate test output signal is provided to open collector device 250 which can be read by the downstream circuitry. If, through the foregoing test sequence, the test output does not change states, a problem with a particular row or row driver has been assumed by external logic.

FIG. 8 illustrates graphically a series of row drivers of an RDC tested in accordance with the present technique, employing circuitry such as that illustrated in FIG. 7. As shown in FIG. 8, the test sequence, indicated by reference numeral 256, consists of a series of output pulses which may be represented along vertical axis 258. At specific time intervals 260, the test sequence proceeds through the rows driven by the RDC being tested. In FIG. 8., the test enable signal TESTP* discussed above, is applied and remains applied throughout the test sequence as indicated by trace 262. As previously discussed, the rows are initialized to $V_{DD}$. Rows are then sequentially driven low, to $D_{SS}$ beginning with a first row as indicated at (trace 264 for a row labeled Q. The test output is monitored through this sequence at output IC-PAD 250 as indicated by trace 266. Each row is driven low for a time interval 260 and then returned to its initial on state ($V_{DD}$). Thus, each subsequent row driving step produces a trace which may be represented as 268, 270, and so forth, for each subsequent row.

As indicated above, a change in state is expected as each subsequent row is driven low, as indicated at pulses 272 in FIG. 8. A tolerance 274 equal to the gate-to-source threshold of the row driver device test circuit is preferably lower than the detectable change in state in the event of a short circuit of the row. Such short circuits will be manifested in lower than expected drops in output level, as indicated at reference numeral 276. In the illustrated example, rows $Q_3$ and $Q_4$ are likely shorted to one another. As a result, upon enabling these rows, the test output as provided by trace 266 will not go low as would have been expected for normal test. A similar variation from the expected results would occur in test trace 266 in the event of a short between a row and the positive bias supply $V_{DD}$ or a short between a row and ground.

As will be appreciated by those skilled in the art, the circuitry described above may be implemented along with driver circuitry in an economical and compact manner, with the test circuitry itself occupying only minimal real estate in the overall design. Moreover, the test circuitry, permitting verification of each row driver individually in a very straightforward process, includes a minimal number of small individual components for the tasks performed. Through the test sequence, row test circuits add very little to the cost of the row drivers, with minimal likelihood of test circuitry-induced failures. It should also be appreciated that the circuits discussed in FIGS. 5 and 7 may be used in conduction to provide a means of testing for shorts between rows, shorts between rows and ground, shorts between rows and positive bias supplies, and shorts between rows and negative bias supplies. A single test circuit may be provided using a triple-input NAND gate. The first input would be the TESTENABLE signal. The second input would be from the wired-OR line 130 provided in FIG. 5. The third input would be the inverted wired-NOR line 212 provided in FIG. 7.

It should be noted that the foregoing structure and procedure may be subject to various modifications and enhancements to further enhance the utility of the circuitry in detecting various types of defects. For example, similar test circuitry may be incorporated for selectively testing driver circuitry for defects such as shorts to high voltage bias lines or other supplies in a multi-level driver. Similarly, the circuitry may be employed various devices other than digital detectors to test for shorts and other defects. Such devices might include any application wherein rows, columns, lines, or similar series of circuits are driven, such as solid state displays, thermal facsimile machines, and so forth.

What is claimed is:

1. A test circuit for a discrete picture element detector, the detector including row and column electrodes coupled to drive circuitry for sampling signals generated at locations of the detector, the test circuit comprising:
   at least two row test circuit modules for enabling rows of the detector;
   a first test enable input configured to apply a first test enable signal and coupled to a bias generator circuit, the bias generator circuit coupled to a positive bias and ground and configured to produce a second test enable signal;
   a second test enable input configured to receive the second test enable signal and coupled to the test circuit modules for enabling test sequences for corresponding rows; and
   a comparison module coupled to the test circuit modules and to the first test enable input to compare output signals generated by the test circuit modules during the test sequences to reference signals.

2. The test circuit of claim 1, wherein each of the test circuit modules includes a set of solid state devices coupled to row driver circuitry for a respective row of the detector.

3. The test circuit of claim 2, wherein the set of solid state devices are coupled between high and low sides of a bias supply bus.

4. The test circuit of claim 1, wherein the second test enable signal is a negative logic signal.

5. The test circuit of claim 1, wherein the test circuit modules and the test enable are disposed on a common support with row driver circuitry.

6. A row control device for controlling operation of a plurality of rows of a discrete picture element detector, the device comprising:
   row driver circuitry having a plurality of row driver modules configured to be coupled to a plurality of row electrodes for respective rows of the detector, and to apply enable signals for sampling signals generated at locations on the detector; and
   row test circuitry disposed on a common device with the row driver circuitry, the row test circuitry including a row test module for each row output of the row driver module, a first test enable input configured to apply a first test enable signal and coupled to a bias generator circuit, the bias generator circuit coupled to a positive bias and ground and configured to produce a second test enable signal, a second test enable input configured to receive the second test enable signal and coupled to the test circuit modules for enabling test sequences for corresponding rows, and at least one comparison module coupled to the test module and to the test enable to compare signals generated during the test sequences to reference signals.

7. The device of claim 6, wherein the test enable is coupled to a plurality of test modules for enabling tests of a corresponding plurality of rows of the detector.

8. The device of claim 6, wherein the device includes at least two sets of row driver circuitry and respective row test circuitry.

9. The device of claim 6, wherein each test module includes a plurality of solid state devices coupled between high and low sides of a bias supply bus.

10. The device of claim 6, wherein the second test enable signal is a negative logic signal.

11. The device of claim 9, wherein one of the solid state devices of each test module is coupled to a driver output line of a respective row driver circuit.

12. A discrete picture element detector system for a digital x-ray system, the detector system comprising:
   a detector panel including rows and columns of electrodes and detection circuitry at row and column crossings for generating signals in response to receipt of radiation during an x-ray examination;
   column driver circuitry coupled to the column electrodes for sampling the signals;
   row driver circuitry coupled to the row electrodes for enabling sampling of the signals; and
   driver test circuitry coupled to the row driver circuitry, the test circuitry including a plurality of row test modules for enabling rows of the detector, a first test enable input configured to apply a first test enable signal and coupled to a bias generator circuit, the bias generator circuit coupled to a positive bias and ground and configured to produce a second test enable signal, a second test enable input configured to receive the second test enable signal and coupled to the test circuit modules for enabling test sequences for corresponding rows, and a comparison module coupled to the test modules and to the test enable to compare signals generated during the test sequences to reference signals.

13. The detector system of claim 12, wherein row driver circuitry for a series of rows of the detector are provided on a common circuit module with respective driver test circuitry.

14. The detector system of claim 13, comprising a plurality of circuit modules, each circuit module including row driver circuitry and driver test circuitry for a portion of the rows of the detector panel.

15. The detector system of claim 12, wherein the driver test circuitry includes an individual test module for each row of the detector panel.

16. The detector system of claim 12, wherein each test module includes a plurality of solid state devices coupled between high and low sides of a supply bus.

17. The detector system of claim 16, wherein each second test enable signal is coupled to a plurality of test modules and to the low side of the supply bus.

18. The detector system of claim 16, wherein one of the solid state devices of each test module is coupled to a driver output line of a respective row driver circuit.

19. A test circuit comprising:

a first test enable input;

a first bias circuit coupled to the first test enable input, the first test enable input configured to apply a first test enable signal, and the first bias circuit configured to produce a second test enable signal;

a second bias circuit coupled to the first test enable input, the first test enable input configured to apply a first test enable signal, and the second bias circuit configured to produce a third test enable signal;

a first test module coupled to the second test enable signal and configured to test for shorts in a plurality of row electrodes of a detector, the shorts being one of a short from a first row to a second row, a short from a first row to ground and a short from a first row to a negative bias supply; and a second test module coupled to the third test enable signal and configured to test for shorts in a plurality of row electrodes of a detector, the shorts being one of a short from a first row to a second row, a short from a first row to ground, and a short from a first row to a positive bias supply.

20. The test circuit of claim 19, wherein the first bias circuit is coupled to a positive bias supply and a negative bias supply.

21. The test circuit of claim 19, wherein the second test enable signal is a positive logic signal.

22. The test circuit of claim 19, wherein the second bias circuit is coupled to a positive bias supply and ground.

23. The test circuit of claim 19, wherein the third test enable signal is a negative logic signal.

24. The test circuit of claim 19, comprising a NAND gate coupled between the first test module and the second test module.

25. A method for detecting defects in a discrete picture element detector system, the detector system including a test circuit as well as a detector panel including rows and columns of electrodes and detection circuitry at row and column crossings for generating signals, column driver circuitry coupled to the column electrodes for sampling the signals, and row driver circuitry coupled to the row electrodes for enabling sampling of the signals, the method comprising the steps of:

pre-enabling a plurality of rows to a positive bias ON-state;

individually and sequentially driving each row to a negative bias OFF-state; and comparing output signals from a test circuit with a reference signal to determine whether each test enabled row is defective.

26. The method of claim 25, wherein the test sequence for the plurality of rows is pre-enabled by a single test enable signal.

27. The method of claim 25, wherein a row test circuit is provided for each row of the detector.

28. The method of claim 27, wherein each row test circuit is coupled to a respective row driver circuit and is pre-enabled by an output signal.

29. The method of claim 27, wherein each row test circuit includes a plurality of solid state devices coupled between high and low sides of a supply bus.

30. The method of claim 25, wherein the reference signal is a test enable signal applied to the test enable circuit.

* * * * *